(12) United States Patent
Rodder

(10) Patent No.: US 6,261,887 B1
(45) Date of Patent: Jul. 17, 2001

(54) TRANSISTORS WITH INDEPENDENTLY FORMED GATE STRUCTURES AND METHOD

(75) Inventor: Mark S. Rodder, University Park, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/136,333

(22) Filed: Aug. 19, 1998

Related U.S. Application Data

(60) Provisional application No. 60/057,148, filed on Aug. 28, 1997.

(51) Int. Cl.[7] .................................................. H01L 21/8238
(52) U.S. Cl. ........................... 438/218; 438/584; 438/902
(58) Field of Search ..................................... 438/197, 199, 438/218, 229, 230, 300, 584, 597, 902, 275, 581, 585, 926, 689

(56) References Cited

U.S. PATENT DOCUMENTS

| | | | |
|---|---|---|---|
| 4,948,745 | 8/1990 | Pfiester et al. | 437/41 |
| 5,021,354 | 6/1991 | Pfiester | 437/57 |
| 5,168,072 | * 12/1992 | Moslehi | 438/100 |
| 5,384,729 | 1/1995 | Sameshima | 365/145 |
| 5,397,909 | * 3/1995 | Moslehi | 257/383 |
| 5,654,242 | 8/1997 | Komatsu | 438/585 |
| 5,716,861 | * 2/1998 | Moslehi | 438/231 |
| 5,956,591 | * 9/1999 | Fulford et al. | 438/305 |
| 5,976,924 | * 11/1999 | Gardner et al. | 438/230 |
| 5,994,193 | * 11/1999 | Gardner et al. | 438/303 |

FOREIGN PATENT DOCUMENTS

| | | | |
|---|---|---|---|
| 0 727 815 A2 | 8/1996 | (EP) | H01L/21/28 |
| 60-045053 | 3/1985 | (JP) . | |

* cited by examiner

Primary Examiner—Richard Booth
Assistant Examiner—Christopher Lattin
(74) Attorney, Agent, or Firm—Jacqueline J. Garner; W. James Brady, III; Frederick J. Teleky, Jr.

(57) ABSTRACT

Transistors may be fabricated by isolating a first region (16) of a semiconductor layer from a second region (18) of the semiconductor layer (12). A first disposable gate structure (26) of the first transistor may be formed over the first region (16) of the semiconductor layer (12). A second disposable gate structure (28) of the second, complementary transistor may be formed over the second region (18) of the semiconductor layer (12). A capping layer (60) may be formed over the first and second regions (16, 18) including the first and second disposable gate structures (26, 28). A portion (62, 64) of the first and second disposable gate structures (26, 28) may be exposed through the capping layer (60). A second disposable gate cap (66) may be formed over the exposed portion (64) of the second disposable gate structure (28) and at least part of the first disposable gate structure (26) removed. A first gate structure (70) of the first transistor may be formed in the place of removed part of the first disposable gate structure. In one embodiment, a second gate structure (80) of the second transistor may comprise the second disposable gate structure (28). In another embodiment, a first disposable gate cap (76) may be formed over the exposed portion (78) of the first gate structure and the second disposable gate cap (66) over the second disposable gate structure (28) may be removed. The second gate structure (80) of the second transistor may then be formed in the place of the removed second disposable gate structure (28).

20 Claims, 3 Drawing Sheets

TRANSISTORS WITH INDEPENDENTLY FORMED GATE STRUCTURES AND METHOD

RELATED APPLICATIONS

This application claims priority under 35 USC §119 (e) (1) of provisional application No. 60/057,148, filed Aug. 28, 1997.

This application is related to copending U.S. application Ser. No. 09/136,749, filed Aug. 19, 1998, entitled "Transistor Having Localized Source and Drain Extensions and Method" and copending U.S. application Ser. No. 09/136,750, filed Aug. 19, 1998, now U.S. Pat. No. 5,976,937, granted Nov. 2, 1999, entitled "Transistor Having Ultrashallow Source and Drain Junctions with Reduced Gate Overlap and Method".

TECHNICAL FIELD OF THE INVENTION

This invention relates generally to the field of semiconductor devices, and more particularly to transistors with independently formed gate structures and method.

BACKGROUND OF THE INVENTION

Modern electronic equipment such as televisions, telephones, radios and computers are generally constructed of solid state devices. Solid state devices are preferred in electronic equipment because they are extremely small and relatively inexpensive. Additionally, solid state devices are very reliable because they have no moving parts, but are based on the movement of charge carriers.

Solid state devices include transistors, capacitors, resistors and the like. One type of transistor is complementary metal oxide semiconductor (CMOS) transistors. CMOS transistors are a pair of transistors of opposite type used together. CMOS transistors may be used for low-dissipation logic circuits and the like.

The gates of CMOS transistors are typically constructed of a neutral material and later doped to opposite types such as n-type and p-type. The neutral gate material is generally a material that will not adversely affect the performance of either type of gate. As a result, the gate material may not be particularly well suited for either type gate.

SUMMARY OF THE INVENTION

Accordingly, a need has arisen in the art for improved complementary metal oxide semiconductor (CMOS) and other types of transistors. The present invention provides transistors with independently formed gate structures and method that substantially eliminate or reduce the disadvantages and problems associated with prior transistors.

In accordance with the present invention, a semiconductor device may be fabricated by isolating a first region of a semiconductor layer from a second region of the semiconductor layer. A first disposable gate structure of a first transistor may be formed over the first region of the semiconductor layer. A second disposable gate structure of a second, complementary transistor may be formed over the second region of the semiconductor layer. A capping layer may be formed over the first and second regions including the first and second disposable gate structures. A portion of the first and second disposable gate structures may be exposed through the capping layer. A second disposable gate cap may be formed over the exposed portion of the second disposable gate structure and at least part of the first disposable gate structure may be removed. At least part of a first gate structure of the first transistor may be formed in the place of removed part of the first disposable gate structure.

More specifically, in accordance with one embodiment of the present invention, a second gate structure of the second transistor may comprise the second disposable gate structure. In another embodiment, a first disposable gate cap may be formed over an exposed portion of the first gate structure. The second disposable gate cap over the second disposable gate structure and at least part of the second disposable gate structure may then be removed. At least part of a second gate structure of the second transistor may then be formed in the place of the removed part of the second disposable gate structure.

In one embodiment, the first gate structure of the first transistor may comprise an in-situ doped first gate body. The second gate structure of the second transistor may comprise an in-situ doped second gate body. In this embodiment, the first and second gate bodies may each comprise polysilicon material.

In accordance with another embodiment of the present invention, a first gate body of the first gate structure may comprise a first material. A second gate body of the second gate structure may comprise a second, disparate material. In this embodiment, the first and second materials may comprise disparate metals such as platinum and aluminum.

In accordance with another embodiment of the present invention, a first gate body of the first gate structure may comprise a first material. A second gate body of the second gate structure may comprise a second, disparate material. In this embodiment, the first material may comprise p-type doped noncrystalline material comprised in part of silicon or of a silicon-germanium composition. The second material may comprise aluminum.

In accordance with another embodiment of the present invention, a first gate body of the first gate structure may comprise a first material. A second gate body of the second gate structure may comprise a second, disparate material. In this embodiment, the first material remains as the original gate material and may comprise p-type doped non-crystalline material comprised in part of silicon or of a silicon-germanium composition. The second material may comprise aluminum or n-type doped non-crystalline material comprised in part of silicon or of a silicon-germanium composition.

In accordance with another embodiment of the present invention, a first gate body of the first gate structure may comprise a first material. A second gate body of the second gate structure may comprise a second, disparate material. In this embodiment, the first material remains as the original gate material and may comprise n-type doped non-crystalline material comprised in part of silicon or of a silicon-germanium composition. The second material may comprise platinum or p-type doped non-crystalline material comprised in part of silicon or of a silicon-germanium composition.

In accordance with another embodiment of the present invention, a first gate body of the first gate structure may comprise a first material. A second gate body and/or second gate dielectric of the second gate structure may comprise a second, disparate material for the gate material and/or the gate dielectric. In this embodiment, the first material remains as the original gate material and may comprise n-type doped non-crystalline material comprised in part of silicon or of a silicon-germanium composition. The first gate dielectric material remains as the original gate dielectric and may comprise oxide. The second material may comprise platinum or p-type doped non-crystalline material comprised in part of silicon or of a silicon-germanium composition. The second gate dielectric material may comprise an oxide/nitride composite or nitride.

Important technical advantages of the present invention include providing transistors with independently formed gate structures. In particular, gate bodies and/or dielectrics of the transistors may be independently formed. The transistors may be complementary transistors. Accordingly, the gate structure of each transistor may be formed without regard to material and/or processes of the other.

Another technical advantage of the present invention includes providing in-situ formed gate bodies for the transistors. In particular, a first gate body of a first transistor may be in-situ doped prior to formation of the second gate structure of the second transistor. The second gate structure of the second transistor may be in-situ doped while the first gate body is protectively capped. Accordingly, additional masking and doping steps need not be conducted during the fabrication process.

Still another technical advantage of the present invention includes providing in-situ doped source and drain regions for the transistors. In particular, the source and drain of one of the transistors may be insitu doped while the other complementary transistor is masked. The newly formed source and drain of the first transistor may then be masked while the source and drain of the second transistor is in-situ doped. Accordingly, the source and drains of each of the transistors may be independently formed without regard to the materials and/or processes of the other.

Yet another technical advantage of the present invention includes providing transistors having gate bodies of disparate materials. In particular, the gate body of the first transistor may be formed prior to that of the second transistor. The gate body of the second transistor may be formed while the gate body of the first transistor is protectively capped. Accordingly, the gate bodies of the transistor may each comprise materials well suited for their type of transistor.

Other technical advantages will be readily apparent to one skilled in the art from the following figures, description, and claims.

BRIEF DESCRIPTION OF THE DRAWINGS

For a more complete understanding of the present invention and its advantages thereof, reference is now made to the following description taken in conjunction with the accompanying drawings, wherein like reference numerals represent like parts in which.

DETAILED DESCRIPTION OF THE INVENTION

The preferred embodiments of the present invention and its advantages are best understood by referring now in more detail to FIGS. 1A–I of the drawings, in which like numerals refer to like parts throughout the several views. FIGS. 1A–I illustrate fabrication of complementary metal oxide semiconductor (CMOS) field effect transistors (FET) with independently formed gate structures. As described in more detail below, the independently formed gate structures may comprise disparate and/or in-situ doped materials. The materials of each gate structure may be well suited for the type of transistor in which it is used.

Figure 1A:
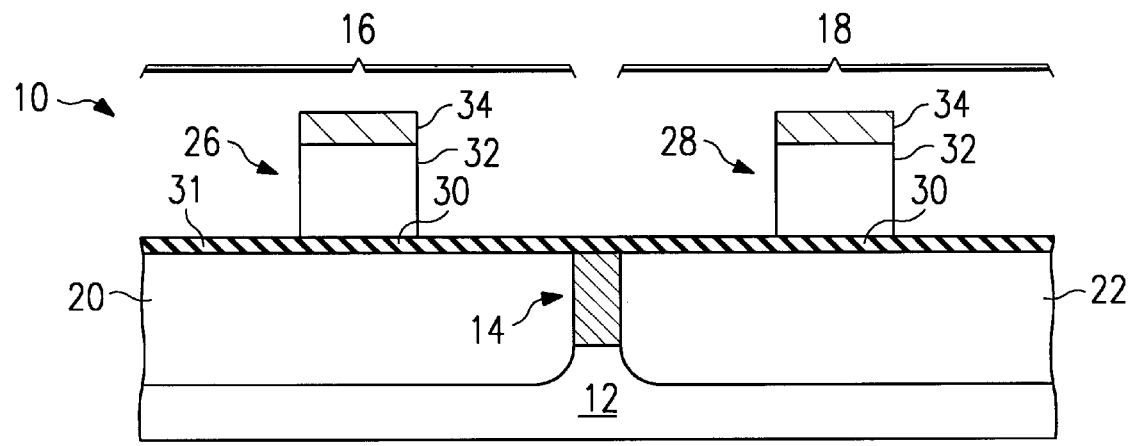
FIGS. 1A–I are a series of schematic crosssectional sectional diagrams illustrating fabrication of complementary transistors with independently formed gate structures in accordance with one embodiment of the present invention.

FIG. 1A illustrates an initial semiconductor structure 10 for constructing the complementary transistors in accordance with one embodiment of the present invention. The complementary transistors may be of a deep sub-micron gate length, tenth-micron and below. It will be understood that the complementary transistors may be otherwise sized within the scope of the present invention. It will be further understood that non-complementary transistors may be used within the scope of the present invention.

The initial semiconductor structure 10 may comprise a semiconductor layer 12. The semiconductor layer 12 may be a substrate such as a wafer. In this embodiment, the semiconductor layer 12 may comprise a single-crystalline silicon material. It will be understood that the semiconductor layer 12 may also be a layer of semiconductor material formed on a substrate. For example, the semiconductor layer 12 may be an epitaxial layer grown on a wafer, a semiconductor on insulation (SOI) system, and the like.

In one embodiment described in detail below, the first transistor may comprise a p-type transistor and the second transistor may comprise an n-type transistor. In this embodiment, the first region 16 may comprise an n-well 20 formed in the semiconductor layer 12 and the second region 18 may comprise a p-well 22 formed in the semiconductor layer 12. The n-well 20 may comprise the single-crystalline silicon material of the semiconductor layer 12 doped with an n-type dopant such as phosphorus, arsenic or antimony. The p-well 22 may comprise the single-crystalline silicon material of the semiconductor layer 12 doped with a p-type dopant such as boron. It will be understood that other types of transistors may be fabricated within the scope of the present invention. For example, the transistors may both be n-type transistors or p-type transistors. It will be further understood that the semiconductor layer 12 may comprise other materials or be otherwise doped within the scope of the present invention.

An isolation structure 14 may be formed in the semiconductor layer 12. The isolation structure 14 may separate the semiconductor layer 12 into a first region 16 and a second region 18. For sub-micron applications, the isolation structure 14 may comprise a shallow trench isolation structure. It will be understood that other types of isolation structures may be used within the scope of the present invention.

A first disposable gate structure 26 may be formed over the first region 16 of the semiconductor layer 12. Similarly, a second disposable gate structure 28 may be formed over the second region 18 of the semiconductor layer 12. The gate structures 26 and 28 are disposable in that one or more gates may be later removed and replaced. However, disposable gate structure 26 or 28 may remain as a gate structure.

In one embodiment, the first and second disposable gate structures 26 and 28 may be formed by the same processing steps and comprise the same materials. In this embodiment, the first and second disposable gate structures 26 and 28 may each comprise a buffer segment 30, a readily etchable segment 32 and a cap segment 24. As described in more detail below, the readily etchable segment 32 may allow the disposable gate structures 26 and/or 28 to be easily removed. The buffer segment 30 may be disposed between the readily etchable segment 32 and the semiconductor layer 12 to prevent etching of the semiconductor layer 12 during removal of the readily etchable segment 32. The cap segment 34 may be disposed over the readily etchable segment 32 to prevent growth, salicidation, or other processing of the readily etchable segment 32 during subsequent processing steps to form the source and drains of the complementary transistors.

In one embodiment, the buffer segment 30 may comprise the gate dielectric of one or both of the transistors. In this embodiment, the buffer segment 30 may comprise a composite oxide nitride, a nitride or the like. In another embodiment, the buffer segment 30 may be removed and replaced with a gate dielectric. In this embodiment, the buffer segment 30 may comprise an oxide, silicongermanium, or the like. In these and other embodiments, the buffer segments 30 may be part of a buffer layer 31 disposed over the semiconductor layer 12. The buffer layer 31 may act as an etch stop during formation of the disposable gate structures 26 and 28.

In one embodiment, the readily etchable segment 32 may comprise the gate body of one of the transistors. In this embodiment, the readily etchable segment 32 may comprise non-crystalline silicon or silicon-germanium in-situ or implant doped with p-type dopants such as boron where the readily etchable segment 32 will form the gate body of a p-type transistor or semiconductor material in-situ or p-type transistor or semiconductor material in-situ or implant doped n-type dopants such as arsenic or phosphorus where the readily etchable segment 32 will form the gate body of an n-type transistor. In another embodiment, the readily etchable segments 32 may be removed and replaced with a gate body of the transistor. In this embodiment, the readily etchable segment 32 may comprise a non-nitride material such as silicon, silicon-germanium and the like. The materials of the buffer segment 30 and readily etchable segment 32 should be relatively etchable with respect to each other to allow the buffer segment 30 to act as an etch stop to etching of the readily etchable segment 32. The cap segment 34 may comprise a dielectric such as oxide. It will be understood that the buffer segment 30, readily etchable segment 32 and capped segment 34 may comprise other materials within the scope of the present invention. It will be further understood that the disposable gate structures 26 and 28 may comprise other materials and/or layers within the scope of the present invention.

Figure 1B:
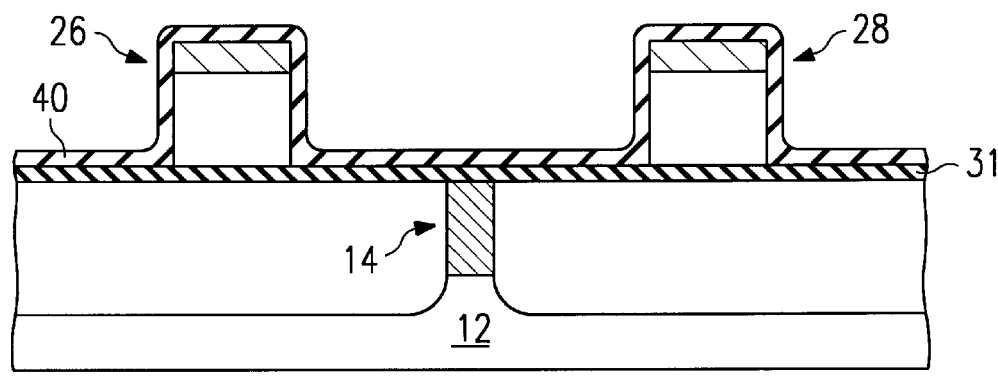

Referring to FIGURE 1B, an insulating layer 40 may be formed over the first and second regions 16 and 18. A sidewall re-oxidation may be performed prior to formation of the insulating layer 40. The re-oxidation may rebuild edges of the buffer segment 30 that were etched in forming the disposable gate structures 26 and 28 and grow along edges of the readily etchable segments 32.

In one embodiment, the insulating layer 40 may be deposited over the semiconductor layer 12 and the disposable gate structures 26 and 28. In this embodiment, the insulating layer 40 may be deposited on the buffer layer 31 and disposable gate structures 26 and 28. The insulating layer 40 may comprise an oxide layer, a nitride layer or the like. The insulating layer 40 may be between 50–150 angstroms thick. It will be understood that the insulating layer 40 may comprise other materials and thicknesses capable of insulating semiconductor elements within the scope of the present invention.

Figure 1C:
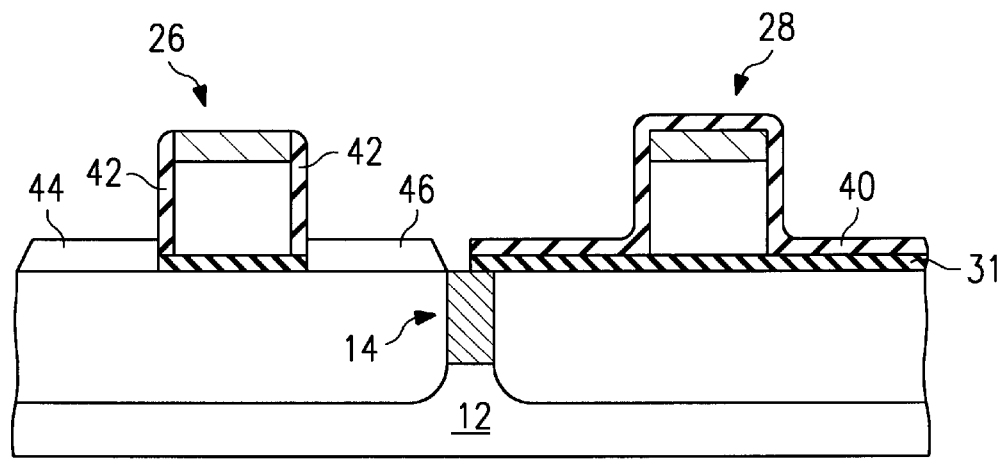

Referring to FIG. 1C, a portion of the insulating layer 40 over the first region 16 may be removed to leave a first side wall insulator 42 about the first disposable gate structure 26. In one embodiment, this may be accomplished by masking the insulating layer 40 over the second region 18 and anisotropically etching the insulation layer 40 over the first region 16. It will be understood that the first side wall insulator 42 may be otherwise formed within the scope of the present invention. A portion of the buffer layer 31 over the first region 16 may also be removed to expose the semiconductor layer 12 in the first region 16. In one embodiment, the portion of the buffer layer 31 over the first region 16 may be removed by the anisotropic etch used to remove the portion of the insulating layer 40 over the first region 16.

A source 44 and a drain 46 may next be formed for the first transistor. In one embodiment, as shown by FIG. 1C, the source 44 and drain 46 may be raised. In this embodiment, the raised source 44 and drain 46 may comprise a doped epitaxial layer of silicon or silicon-germanium formed over the first region 16 of the semiconductor layer 12 adjacent to the disposable gate structure 26. Preferably, the raised source 44 and drain 46 are in-situ doped by appropriate means of deposition. Alternatively, the source 44 and drain 46 may be doped after deposition by means such as implant.

For the p-type transistor formed in the first region 16 of the semiconductor layer 12, the epitaxial silicon layer may be doped with a p-type dopant such as boron. Alternatively, the epitaxial silicon layer may be doped with dual dopants comprising p+ dopants over n dopants. It will be understood that the source 44 and drain 46 may comprise other dopants within the scope of the present invention. It will be further understood that the source 44 and drain 46 may be otherwise formed within the scope of the present invention.

Figure 1D:
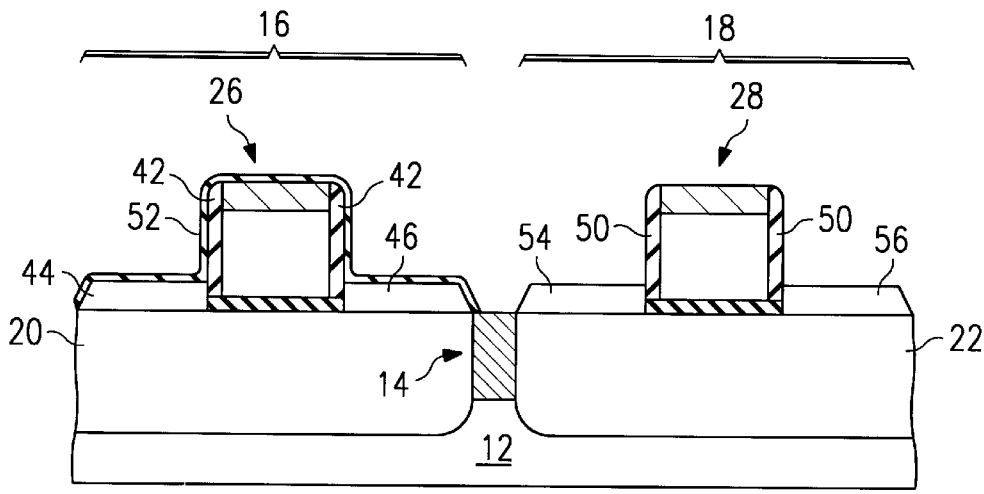

Referring to FIG. 1D, the portion of the insulating layer 40 over the second region 18 may be removed to leave a second side wall insulator 50 about the second disposable gate structure 28. As previously described, this may be accomplished by anisotropically etching the insulation layer 40 over the second region 18. It will be understood that the second side wall insulator 50 may be otherwise formed within the scope of the present invention. A portion of the buffer layer 31 over the second region 18 may also be removed to expose the semiconductor layer 12 in the second region 18. In one embodiment, this portion may be removed by the anisotropic etch used to remove the portion of the insulating layer 40 over the second region 18.

A masking layer 52 may be deposited over the semiconductor layer 12. The masking layer 52 may protect previously formed structures such as the source 44 and drain 46 of the first transistor from further processing to form a source and a drain for the second transistor. In one embodiment, the masking layer 52 may cover the first disposable gate structure 16, first side wall insulator 42, source 44 and drain 46 of the first transistor. In this embodiment, the masking layer 52 may be deposited over the semiconductor layer 12 and etched from the second region 18. A portion (not shown) of the masking material may remain on the second side wall insulator 50 of the second transistor. It will be understood that the masking layer 52 may be otherwise formed within the scope of the present invention. For example, the masking layer 52 may be deposited prior to removal of the insulating and buffer layers 40 and 31 in the second region 18 and an anisotropic etch to remove masking, insulating and buffer layers 52, 40 and 31 from the second region 18 at the same time.

The masking layer 52 may comprise a layer of nitride. In this embodiment, the nitride layer may be approximately 50–100 angstroms thick. It will be understood that the masking layer 52 may comprise other materials not subject to epitaxial growth within the scope of the present invention.

A source 54 and a drain 56 may next be formed for the second transistor. In one embodiment, as shown by FIG. 1D, the source 54 and drain 56 may be raised. As previously described in connection with the raised source 44 and drain 46 of the first transistor, the raised source 54 and drain 56 may comprise a doped epitaxial layer of silicon or silicongermanium formed over the second region 18 of the semiconductor layer 12 adjacent to the disposable gate 28. Preferably, the raised source 54 and drain 56 are in-situ doped by appropriate means of depositions. Alternatively, the source 54 and drain 56 may be doped after deposition by means such as implant.

For the n-type transistor formed in the second region 18 of the semiconductor layer 12, the epitaxial silicon layer may be doped with an n-type dopant such as phosphorous, arsenic or antimony. Alternatively, the epitaxial silicon layer may be doped with dual dopants comprising n+ dopants over p dopants. It will be understood that the source 54 and drain 56 of the second transistor may be otherwise formed within the scope of the present invention.

The masking layer 52 may be removed at this point. In one embodiment, the masking layer 52 may be removed by a conventional anisotropic etch. A portion (not shown) of the masking material may remain on the first side wall insulator 42 of the first transistor. It will be understood that the masking layer 52 may be otherwise removed within the scope of the present invention.

After the masking layer 52 has been removed, the raised sources 44 and 54 and drains 46 and 56 may be further processed. For example, in the single or dual doped source and drain embodiment, the sources 44 and 54 and drains 46 and 56 may be subjected to rapid thermal annealing (RTA) to diffuse the dopants depending on desired gate to source and drain overlap. It will be understood that the raised sources 44 and 54 and drains 46 and 56 may be otherwise processed within the scope of the present invention.

The sources 44 and 54 and drains 46 and 56 may also be cladded. The cladding forms a low resistance material over the raised source 44 and 54 and drains 46 and 56 by means of salicidation or formation of a metal layer over a portion of the raised source 44 and 54 and drains 46 and 56. Cladding at this stage prior to formation of the gate structures of the first and second transistors may reduce later heat treatments to which the gate structures are subject.

Figure 1E:
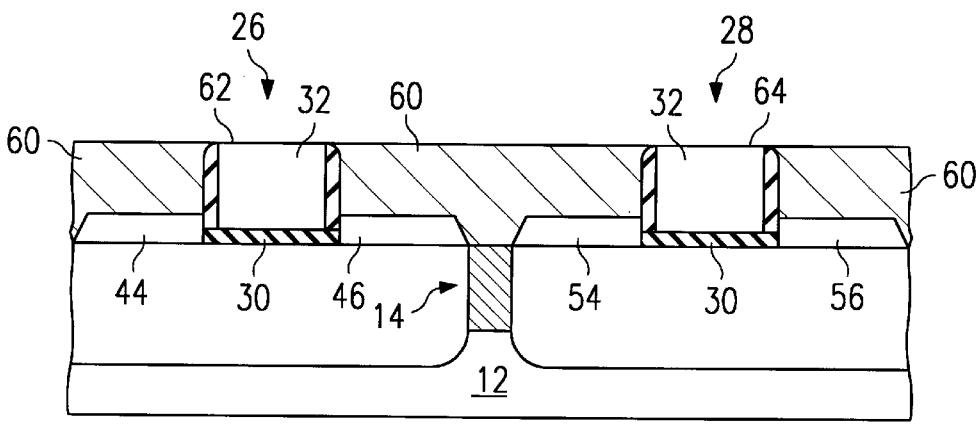

Referring to FIG. 1E, a capping layer 60 may be formed over the first and second regions 16 and 18 of the semiconductor layer 12 exposing a portion 62 of the first disposable gate structure 26 and a portion 64 of the second disposable gate structure 28. In one embodiment, the capping layer 60 may be deposited directly onto the semiconductor structure and planarized to expose the readily etchable segments 32 of the first and second disposable gate structures 26 and 28. In this embodiment, the capping layer 60 may be deposited to substantially the level of the cap segments 34 or higher and then planarized down to the level of the readily etchable segments 32. It will be understood that the capping layer 60 exposing portions of the first and second disposable gate structures 26 and 28 may be otherwise formed within the scope of the present invention.

In one embodiment, the capping layer 60 may comprise an oxide. In this embodiment, the capping layer 60 may be deposited by a chemical vapor deposition (CVD) process and be planarized by a chemical-mechanical polish (CMP), etch back or the like. It will be understood that the capping layer 60 may comprise other materials, be otherwise deposited, planarized and/or etched to expose a portion of the first and second disposable gate structures 26 and 28 within the scope of the present invention.

Figure 1F:
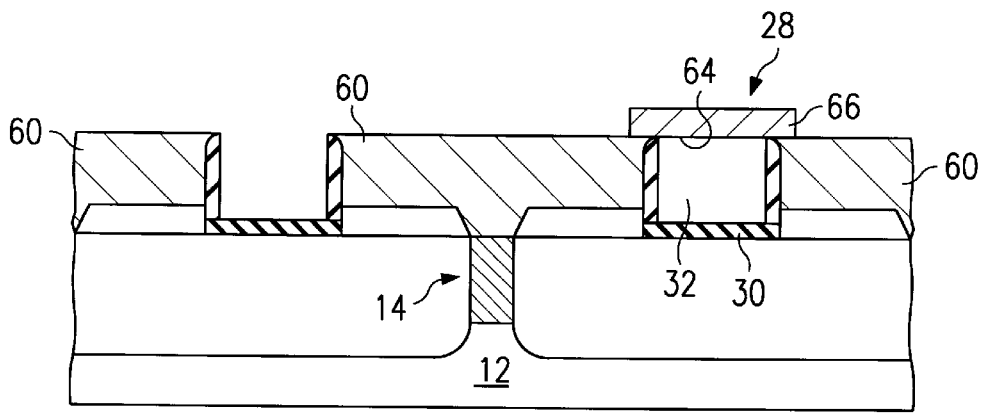

Referring to FIG. 1F, a cap 66 may be formed over the exposed portion 64 of the second disposable gate 28. In one embodiment, the cap 66 may comprise oxide, nitride or other material selectively etchable with respect to the material of the disposable gates. In the nitride embodiment, the cap 66 may be 50–500 angstroms thick. Accordingly, as described in more detail below, the first disposable gate structure 26 may be removed without removing the second disposable gate structure 28 protected by the cap 66.

The first disposable gate structure 26 may next be removed. During removal of the first disposable gate structure 26, the cap 66 will protect the second disposable gate structure 28. In one embodiment, the readily etchable segment 32 of the first disposable gate structure 26 may be removed by etching. As previously described, the buffer segment 30 will prevent the etch of the readily etchable segment 32 from damaging the semiconductor layer 12. After the readily etchable segment 32 has been removed, the buffer segment 30 may in one embodiment be removed by a different etch. In this embodiment, the etch used to remove the buffer segment 30 is preferably highly selective to silicon such that it will not damage the substrate layer 12. It will be understood that the first disposable gate structure 26 may be otherwise removed within the scope of the present invention. It will be further understood that the buffer segment 30 may remain as the gate dielectric of the transistor within the scope of the present invention.

Figure 1G:
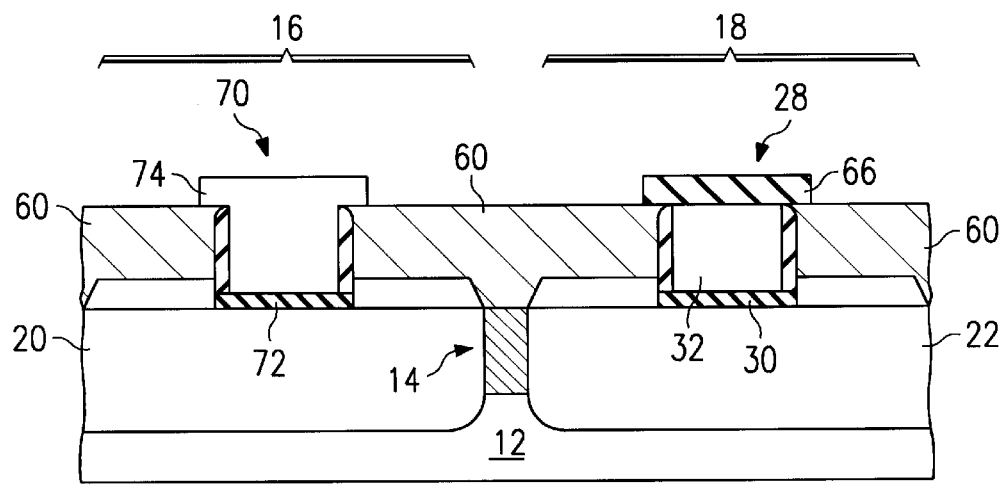

Referring to FIG. 1G, a first gate structure 70 may be formed in the place of the removed first disposable gate structure 26. In one embodiment, the gate structure 70 may comprise a gate insulator 72 and a gate body 74. The gate insulator 72 may be disposed between the gate body 74 and the semiconductor layer 12. It will be understood that the gate structure 70 may be otherwise configured within the scope of the present invention.

In one embodiment, as previously described, the gate insulator 72 may comprise the buffer segment 30. In the embodiment where the buffer segment 30 is removed, the gate insulator 72 may be deposited, grown or otherwise formed. In this embodiment, the gate insulator 72 may comprise a grown oxide such as silicon dioxide, a deposited oxide, a deposited dielectric such as nitride or tantalum oxide, a nitrided dielectric formed by means such as remote plasma nitridation or other conventional nitridation processes. It will be understood that the gate insulator 72 may comprise other dielectric materials capable of insulating the gate body 74 from the semiconductor layer 12.

In one embodiment, the gate body 74 may be etched to form a T-gate and/or planarized to form a non T-gate. Methods such as selective epitaxial deposition on the non T-gate can result in formation of a T-gate due to epitaxial overgrowth. The gate body 74 may comprise a material selected to maximize operation of the p-type first transistor. In one embodiment, the gate body 74 may comprise polysilicon in-situ doped with p-type dopants such as boron and the like with a material being salicided or metal cladded as desired. In another embodiment, the gate body 74 may comprise a metallic material such as platinum. It will be understood that the gate body 74 may comprise other materials within the scope of the present invention.

In the embodiment where the readily etchable segment 32 comprises n-type gate material, the disposable gate structure 28 may comprise the gate structure of the second gate transistor and need not be removed and replaced. In this embodiment, the second disposable gate structure may include salicidation. Thus, the transistors may comprise independently formed gate structures 70 and 28. The independently formed gate structures may comprise disparate and/or in-situ doped materials well suited for the type of transistors in which each is used. In an embodiment where the readily etchable segment 32 comprises p-type material, the first disposable gate structure 26 may be capped and the second disposable gate structure 28 removed and replaced as previously described for disposable gate structure 26. Thus, the designations of the first and second transistors as p-type and n-type transistors is for illustrative purposes and does not limit the scope of the present invention. For example, the transistors may be non-complementary transistors.

Figure 1H:
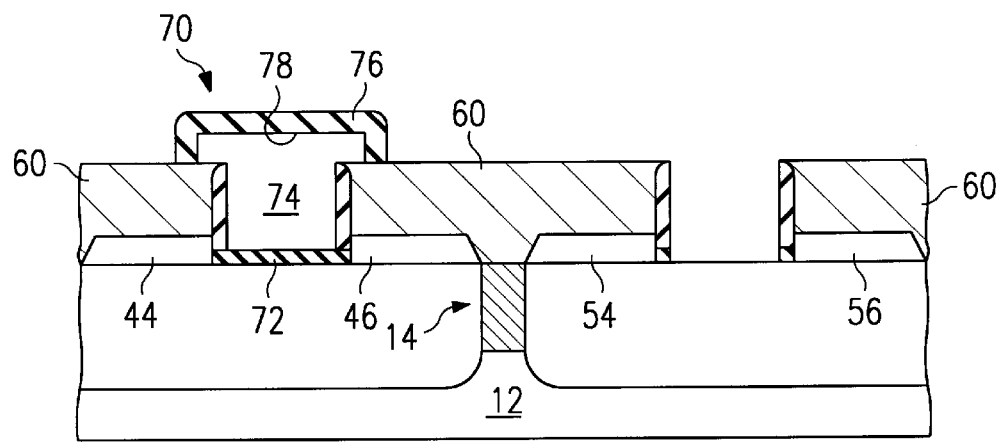

Referring to FIG. 1H, where the second disposable gate structure 28 is to be removed, a cap 76 may be formed over an exposed portion 78 of the first gate structure 70. For the embodiment of FIG. 1H, the exposed portion 78 of the first gate structure 70 may be the top of the gate body 74. As described in more detail below, the cap 76 may protect the first gate structure 70 during formation of the gate structure of the second transistor.

The cap 76 should be etchable relative to the cap 66 and the second gate body 28. Accordingly, the cap 66 and second gate body 28 may be removed and replaced with a second gate structure of the second transistor without affecting the cap 76 and underlying first gate structure 70.

In one embodiment, the cap 76 may comprise an oxide, a nitride such as silicon nitride or the like. In this embodiment, the cap 76 may be 50–500 angstroms thick. It will be understood that the cap 76 may comprise other materials at other thicknesses within the scope of the present invention.

The cap 66 over the second disposable gate structure 28 may then removed to expose the second disposable gate structure 28. In one embodiment, the cap 66 may be removed by a conventional pattern and etch. It will be understood that the cap 66 may be otherwise removed within the scope of the present invention.

The second disposable gate structure 28 may next be removed. During removal of the second disposable gate structure 28, the cap 76 may protect the gate structure 70 of the first transistor. In one embodiment, the readily etchable segment 32 of the second disposable gate structure 28 may be removed by etching. As previously described, the buffer segment 30 will prevent the etch of the readily etchable segment 32 from damaging the semiconductor layer 12. After the readily etchable segment 32 has been removed, the buffer segment 30 may in one embodiment be removed by a different etch. In this embodiment, the etch used to remove the buffer segment 30 is preferably highly selective to silicon such that it will not damage the substrate layer 12. It will be understood that the second disposable gate 28 may be otherwise removed within the scope of the present invention. It will be further understood that the buffer segment 30 may remain as the gate dielectric of the transistor within the scope of the present invention.

Figure 1I:
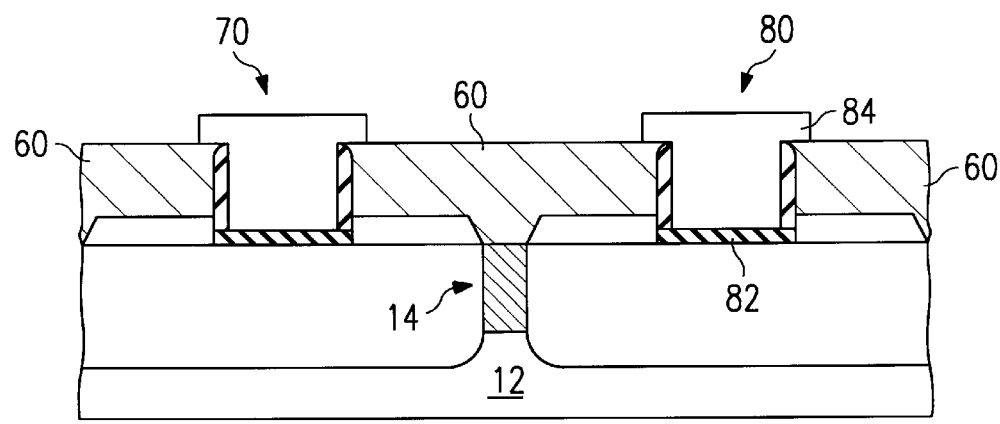

Referring to FIG. 1I, a second gate structure 80 may be formed in the place of the removed second disposable gate structure 28. In one embodiment, the second gate structure 80 may comprise a gate insulator 82 and a gate body 84. The gate insulator 82 may be disposed between the gate body 84 and the semiconductor layer 12. It will be understood that the second gate structure 80 may be otherwise configured within the scope of the present invention.

In one embodiment, as previously described, the gate insulator 82 may comprise the buffer segment 30. In the embodiment where the buffer segment 30 is removed, the gate insulator 82 may be deposited, grown or otherwise formed. In this embodiment, the gate insulator 82 may comprise a grown oxide such as silicon dioxide, a deposited oxide, a deposited dielectric such as nitride or tantalum oxide, a nitrided dielectric formed by means such as remote plasma nitridation or other conventional nitridation processes. It will be understood that the gate insulator 82 may comprise other dielectric material capable of insulating the gate body 84 from the semiconductor layer 12.

In one embodiment, the gate body 84 may be etched to form a T-gate and/or planarized to form a non T-gate. Methods such as selective epitaxial deposition on the non T-gate can result in formation of a T-gate due to epitaxial over growth. The gate body 74 may comprise a material selected to maximize operation of the n-type second transistor. In one embodiment, the gate body 84 may comprise polysilicon in-situ doped with n-type dopants such as phosphorous, arsenic, antimony and the like with the material being salicided or metal cladded as desired. In another embodiment, the second gate body 84 may comprise a metallic material different from the material of the first gate body 74. In this embodiment, the second gate body 84 may comprise aluminum and the like. It will be understood that the second gate body 84 may comprise other materials within the scope of the present invention.

In one embodiment, the cap 76 over the first gate structure 70 may then be removed to expose the first gate structure 70. In one embodiment, the cap 76 may be removed by conventional pattern and etch. It will be understood that the cap 76 may be otherwise removed within the scope of the present invention.

The process of capping and removing all or at least part of the disposable gate structures may be repeated such that any number of transistors may have independently formed gate structures including gate bodies and/or gate dielectrics of the gate structures. The independently formed gate structures may comprise disparate and/or in-situ doped materials well suited for the type of transistor in which each is used. The transistors may be complementary transistors or of the same type. Additionally, the source and drains of the transistors may be independently formed and comprise in-situ doped materials.

For the complementary transistors, the n-type and p-type gates may have an associated gate workfunction which in part determines the threshold voltage of the transistor. The threshold voltage of transistor may be determined by such factors including the gate workfunction, the semiconductor workfunction, and the dopant concentration in the transistor channel region.

As the gate dielectric thickness decreases, the dopant concentration in the transistor channel region must substantially increase to result in a change of a transistor threshold voltage to a desired value. In a limit of zero dielectric thickness, the dopant concentration in the transistor channel region to change a threshold voltage to a desired value would approach the limit of an infinite dopant concentration. Thus, as gate dielectric thickness is reduced, the control of transistor threshold voltage by dopant density is increasingly difficult. As a result, the threshold voltage or off current of a transistor may be adjusted in part by the gate workfunction and not only by dopant concentration. Since different gate materials or gate types have different associated gate workfunctions which can thus in part determine transistor threshold voltage, and due to difficulties in using dopant density to control threshold voltage, the transistors may comprise different gate materials within the scope of the present invention such that they may have varying threshold voltages in a circuit.

It is recognized that while an application of different gate materials or gate types is for CMOS circuits for which there are complementary n-type and p-type transistors, and different desired threshold voltages for n-type and p-type transistors, many applications for CMOS circuits may require more than simply different threshold voltages for n-type and p-type transistors. Rather, it may additionally be required that particular n-type transistors have themselves different threshold voltages at different locations of the circuit with particular n-type transistors having a low threshold voltage and particular n-type transistors having a high threshold voltage. Similarly, it may additionally be required that particular p-type transistors have themselves different threshold voltages at different locations of the circuit with particular p-type transistors having a low threshold voltage and particular p-type transistors having a high threshold voltage. Thus, the use of varying gate material to set desired threshold voltages may be used for complementary or non-complementary transistors as desired for given circuit applications.

Gate material that may be of interest for p-type MOS devices includes those materials for which the gate workfunction is in the approximate range of 4.7–5.7 electron volts and may include such materials as tungsten (W), platinum (Pt), nickel (Ni), palladium (Pd), ruthenium (Ru), titanium nitride (TiN), p-type silicon (p-Si), or p-type silicon germanium (p-SiGe) with varying germanium (Ge) content. Gate material that may be of interest for n-type MOS devices includes those materials for which the gate workfunction is in the approximate range of 3.7–4.7 electron volts and may include such materials as aluminum (Al), Copper (Cu), nickel (Ni), cobalt (Co), molybdenum (Mo), tungsten (W), titanium nitride (TiN), n-type silicon (n-Si) or n-type silicon germanium (n-SiGe).

While the above description has discussed primarily the use of gate material or gate type with a given gate workfunction to set a threshold voltage, the gate dielectric may, in some cases, be further utilized to in part adjust threshold voltage within the scope of the present invention. For example, although it has been described that as gate dielectric thickness becomes sufficiently small, dopant density cannot sufficiently be used to adjust threshold voltage, it is noted that as gate dielectric thickness is increased or changed, the threshold voltage can increase for a device with the thicker gate dielectric and the same dopant density. Thus, transistors having different desired threshold voltages can be formed with different dielectric thicknesses and/or with different dielectric materials having different dielectric constant with the different dielectric constants being used to change the effective dielectric thickness and thus effective threshold voltage. Gate dielectrics with varying dielectric constants include oxide, nitride, composite oxide-nitride, tantalum pentoxide (Ta205), titanium oxide (TiO) and the like.

Accordingly, the combinations of varying gate workfunction, and/or varying gate electric constant or thickness can be utilized to adjust or determine threshold voltages for complementary or non-complementary transistors in an integrated circuit within the scope of the present invention.

Although the present invention has been described with several embodiments, various changes and modifications may be suggested to one skilled in the art. It is intended that the present invention encompass such changes and modifications as falls within the scope of the appended claims.

What is claimed is:

1. A method of fabricating a semiconductor device, comprising the steps of:

isolating a first region of a semiconductor layer from a second region of the semiconductor layer;

forming a first disposable gate structure of a first transistor over the first region of the semiconductor layer;

forming a second disposable gate structure of a second transistor over the second region of the semiconductor layer;

forming a capping layer over the first and second regions except over a portion of the first and second disposable gate structures;

forming a second disposable gate cap over the exposed portion of the second disposable gate structure;

removing at least part of the first disposable gate structure; and after removing at least a part of the first disposable gate structure and prior to removing the second disposable gate cap, depositing a first gate body material of a first gate structure of the first transistor in place of the removed part of the first disposable gate structure.

2. The method of claim 1, further comprising the steps of:

forming a first disposable gate cap over an exposed portion of the first gate structure;

removing the second disposable gate cap over the second disposable gate structure;

removing at least part of the second disposable gate structure; and after depositing the first gate body, depositing a second gate body of the second gate structure of the second transistor in place of the removed part of the second disposable gate structure.

3. The method of claim 2, further comprising the step of removing the first disposable gate cap over the first gate structure.

4. The method of claim 2, further comprising the step of in-situ doping the first gate body and further comprising the step of in-situ doping the second gate body.

5. The method of claim 2, wherein the first gate body comprises a first material and the second gate body comprises a second, disparate material.

6. The method of claim 5, wherein the first material comprises platinum.

7. The method of claim 5, wherein the second material comprises aluminum.

8. The method of claim 5, wherein the first transistor comprises a p-type transistor, the second transistor comprises a n-type transistor and the gate body of at least one of the transistors is metallic.

9. The method of claim 5, wherein the first transistor comprises a n-type transistor, the second transistor comprises a p-type transistor and the gate body of at least one of the transistors is metallic.

10. The method of claim 1, wherein the first and second transistors comprise CMOS transistors.

11. The method of claim 1, wherein the first and second transistors comprise CMOS field effect transistors.

12. The method of claim 1, wherein the first and second disposable gate structures comprise n-type gate material and the first gate structure comprises p-type gate material.

13. The method of claim 1, wherein the first and second disposable gate structures comprise p-type gate material and the first gate structure comprises n-type gate material.

14. The method of claim 1, the steps of forming the first and second disposable gate structures each further comprising the steps of:

forming a buffer segment over semiconductor layer to prevent etching of the semiconductor layer during removal of a readily etchable segment of the disposable gate structure; and forming the readily etchable segment of the disposable gate structure over the buffer segment.

15. The method of claim 14, wherein the readily etchable segment comprises a non-nitride material.

16. The method of claim 14, the step of forming the capping layer over the first and second regions further comprising the steps of;

depositing the capping layer at least to a level of the readily etchable segments of the first and second disposable gate structures; and planarizing the capping layer to expose the readily etchable segments of the first and second disposable gate structures.

17. The method of claim 2, wherein a dielectric of the first disposable gate structure is not removed.

18. The method of claim 2, wherein a dielectric of the first and second disposable gate structures are not removed.

19. The method of claim 1, further comprising the steps of:

forming an insulating layer over the first and second regions including the first and second disposable gate structures;

removing a portion of the insulating layer over the first region to leave a first sidewall insulator about the first disposable gate structure;

forming a source and a drain of the first transistor;

masking the first region including the source and drain;

removing a portion of the insulating layer over the second region to leave a second sidewall insulator about the second disposable gate structure; and forming a source and a drain of the second transistor.

20. A method of fabricating an integrated circuit chip, comprising the steps of:

isolating a first region of a semiconductor layer from a second region of the semiconductor layer;

forming a first disposable gate structure of a first transistor over the first region of the semiconductor layer;

forming a second disposable gate structure of a second transistor over the second region of the semiconductor layer;

forming a capping layer over the first and second regions except over a portion of the first and second disposable gate structures;

forming a second disposable gate cap over the exposed portion of the second disposable gate structure;

removing the first disposable gate structure;

forming a first gate dielectric over the first region where the first disposable gate structure was removed;

depositing a first gate body over the first gate dielectric;

forming a first disposable gate cap over the first gate body;

then, removing the second disposable gate cap and the second disposable gate structure;

then, forming a second gate dielectric over the second region where the second disposable gate structure was removed; and then depositing a second gate body over the second gate dielectric.

* * * * *